US012742802B2

(12) United States Patent
Zhang et al.

(10) Patent No.: US 12,742,802 B2
(45) Date of Patent: Sep. 22, 2026

(54) POWER DETECTOR DEVICE AND POWER DETECTION METHOD

(71) Applicant: SigmaStar Technology Ltd., Xiamen (CN)

(72) Inventors: Xiang Zhang, Shanghai (CN); Kai Sun, Shanghai (CN); Ze-Wei He, Shanghai (CN); Jian-Feng Xue, Shanghai (CN); Wei-Ping Wang, Zhubei City (TW)

(73) Assignee: SIGMASTAR TECHNOLOGY LTD., Xiamen (CN)

( * ) Notice: Subject to any disclaimer, the term of this patent is extended or adjusted under 35 U.S.C. 154(b) by 300 days.

(21) Appl. No.: 18/621,617

(22) Filed: Mar. 29, 2024

(65) Prior Publication Data

US 2024/0361365 A1 Oct. 31, 2024

(30) Foreign Application Priority Data

Apr. 26, 2023 (CN) ......................... 202310465027.7

(51) Int. Cl.
*G01R 21/00* (2006.01)
*G01R 19/00* (2006.01)

(52) U.S. Cl.
CPC ......... *G01R 21/00* (2013.01); *G01R 19/0038* (2013.01)

(58) Field of Classification Search
CPC ................ G01R 21/00; G01R 19/0038; G01R 19/16552; G01R 31/40
USPC .......................................................... 324/140
See application file for complete search history.

(56) References Cited

U.S. PATENT DOCUMENTS 4,255,707 A * 3/1981 Miller .................. G01R 21/133 324/142
4,749,210 A * 6/1988 Sugasawa .......... B60G 17/0165 280/124.102
5,170,343 A * 12/1992 Matsuda ............... B60W 10/06 701/76
2012/0001600 A1* 1/2012 Yang ................... H02M 1/4225 323/207
2012/0209548 A1* 8/2012 Runkle ..................... G01D 4/00 702/61
2015/0276890 A1* 10/2015 Turner ................... G01R 31/40 324/764.01

(Continued)

FOREIGN PATENT DOCUMENTS

CN 112099561 A 12/2020
GB 2514415 A * 11/2014 .............. H02J 13/12
TW I563262 B * 12/2016 ............... G06F 1/26

*Primary Examiner* — Christopher P Mcandrew
(74) *Attorney, Agent, or Firm* — Edell, Shapiro & Finnan LLC

(57) ABSTRACT

A power detector device includes a voltage generator circuit, a reference circuit, a level hold circuit and a comparator circuit. The voltage generator circuit generates a bias voltage and a detection voltage according to a power supply voltage. The reference circuit generates a first reference voltage according to the power supply voltage. The level hold circuit selectively transmits the first reference voltage to a node according to the bias voltage, outputs a second reference voltage via the node, and holds a level of the second reference voltage after stopping transmitting the first reference voltage to the node. The comparator circuit compares the second reference voltage with the detection voltage to generate a power detection signal.

8 Claims, 4 Drawing Sheets

(56) References Cited

U.S. PATENT DOCUMENTS

| | | | | |
|---|---|---|---|---|
| 2016/0241134 | A1* | 8/2016 | Maruyama | H02M 1/4225 |
| 2016/0291060 | A1* | 10/2016 | Wood | G01R 19/0084 |
| 2017/0052220 | A1* | 2/2017 | Park | G01D 4/004 |
| 2017/0205450 | A1* | 7/2017 | Popov | G01R 21/06 |
| 2017/0279390 | A1* | 9/2017 | Kamimurai | G01R 25/00 |
| 2021/0075413 | A1* | 3/2021 | Kawai | H03K 5/249 |

* cited by examiner

S410 Generate bias voltage and detection voltage according to power supply voltage S420 Generate first reference voltage according to power supply voltage S430 Selectively transmit first reference voltage to node according to bias voltage, output second reference voltage via node, and hold level of second reference voltage after transmitting of first reference voltage is stopped S440 Compare second reference voltage with detection voltage to generate power detection signal

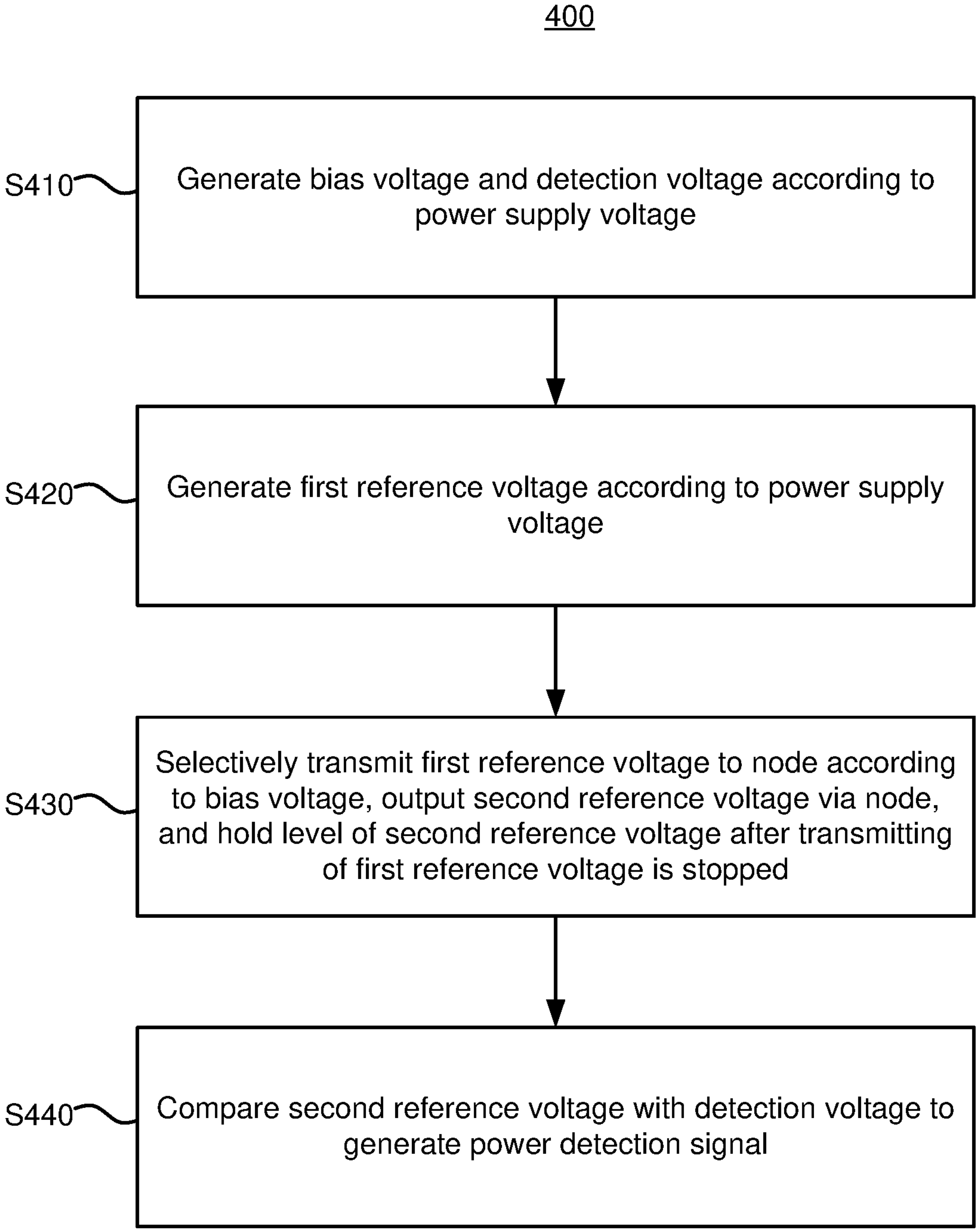

FIG. 4

POWER DETECTOR DEVICE AND POWER DETECTION METHOD

This application claims the benefit of China application Serial No. CN202310465027.7, filed on Apr. 26, 2023, the subject matter of which is incorporated herein by reference.

BACKGROUND OF THE INVENTION

Field of the Invention

The present application relates to a power detector device, and more particularly to a power detector device and a power detection method capable of preventing errors during low-voltage detection.

Description of the Related Art

In current electronic devices, if an instantaneous voltage drop in a power supply voltage or an internal voltage is generated due to factors such as a sudden shutdown, failure or operation errors of circuits in the electronic device may be resulted. In the prior art, a power detector device determines by comparing a reference voltage with a power supply voltage (or a predetermined voltage generated based on a power supply voltage) whether an overly large voltage drop occurs in the power supply voltage. In the prior art above, since the reference voltage is generated based on the power supply voltage, the reference voltage also lowers or becomes deviated when the power supply voltage starts to decrease, such that the reference voltage continually stays to be lower than the predetermined voltage during the decreasing process of the power supply voltage. Thus, the power detector device is made unable to correctly determine an overly large voltage drop that has occurred in the power supply voltage, leading to failures or operation errors of circuits in the system.

SUMMARY OF THE INVENTION

In some embodiments, it is an object of the present application to provide a power detector device and a power detection method capable of preventing errors during low-voltage detection so as to improve the issues of the prior art.

In some embodiments, a power detector device includes a voltage generator circuit, a reference circuit, a level hold circuit and a comparator circuit. The voltage generator circuit generates a bias voltage and a detection voltage according to a power supply voltage. The reference circuit generates a first reference voltage according to the power supply voltage. The level hold circuit selectively transmits the first reference voltage to a node according to the bias voltage, outputs a second reference voltage via the node, and holds a level of the second reference voltage after stopping transmitting the first reference voltage to the node. The comparator circuit compares the second reference voltage with the detection voltage to generate a power detection signal.

In some embodiments, the power detection method includes operations of: generating a bias voltage and a detection voltage according to a power supply voltage; generating a first reference voltage according to the power supply voltage; selectively transmitting the first reference voltage to a node according to the bias voltage, outputting a second reference voltage via the node, and holding a level of the second reference voltage after the transmitting of the first reference voltage to the node is stopped; and comparing the second reference voltage with the detection voltage to generate a power detection signal.

Features, implementations and effects of the present application are described in detail in preferred embodiments with the accompanying drawings below.

BRIEF DESCRIPTION OF THE DRAWINGS

To better describe the technical solution of the embodiments of the present application, drawings involved in the description of the embodiments are introduced below. It is apparent that, the drawings in the description below represent merely some embodiments of the present application, and other drawings apart from these drawings may also be obtained by a person skilled in the art without involving inventive skills.

FIG. 4 is a flowchart of a power detection method according to some embodiments of the present application.

DETAILED DESCRIPTION OF THE INVENTION

All terms used in the literature have commonly recognized meanings. Definitions of the terms in commonly used dictionaries and examples discussed in the disclosure of the present application are merely exemplary, and are not to be construed as limitations to the scope or the meanings of the present application. Similarly, the present application is not limited to the embodiments enumerated in the description of the application.

The term "coupled" or "connected" used in the literature refers to two or multiple elements being directly and physically or electrically in contact with each other, or indirectly and physically or electrically in contact with each other, and may also refer to two or more elements operating or acting with each other. As given in the literature, the term "circuit" may be a device connected by at least one transistor and/or at least one active element by a predetermined means so as to process signals.

Figure 1:
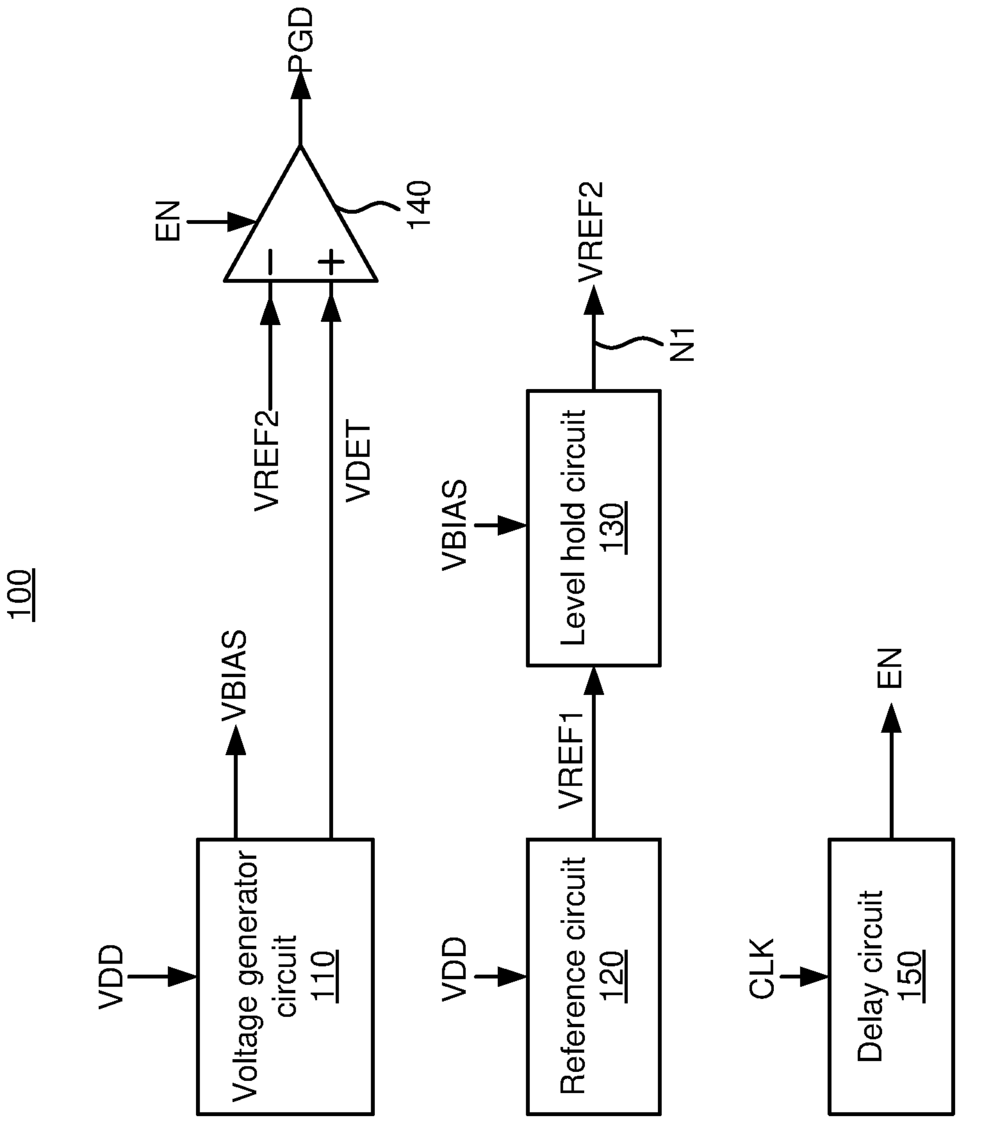
FIG. 1 is a schematic diagram of a power detector device according to some embodiments of the present application.

FIG. 1 shows a schematic diagram of a power detector device 100 according to some embodiments of the present application. In some embodiments, the power detector device 100 can be used to detect whether an abnormal voltage drop occurs in a power supply voltage VDD, and accordingly generate a power detection signal PGD so as to notify other circuits (not shown) in the system to be reset. Thus, operation errors of other circuits in the system caused by an abnormal voltage drop in the power supply voltage VDD can be prevented. In some embodiments, the power supply voltage VDD may be supplied by, for example but not limited to, a battery.

In some embodiments, the power detector device 100 includes a voltage generator circuit 110, a reference circuit 120, a level hold circuit 130, a comparator circuit 140 and a delay circuit 150. The voltage generator circuit 110 generates a bias voltage VBIAS and a detection voltage VDET according to the power supply voltage VDD. In some embodiments, the voltage generator circuit 110 may divide the power supply voltage VDD to generate the bias voltage VBIAS and the detection voltage VDET. For example, the voltage detector device 100 may be, for example but not limited to, a voltage divider circuit including multiple resistors connected in series. It can be understood that, because the bias voltage VBIAS and the detection voltage VDET are obtained by dividing the power supply voltage VDD, a level of each of the bias voltage VBIAS and the detection voltage VDET is directly proportional to a level of the power supply voltage VDD. More specifically, the level of the bias voltage VBIAS and/or the level of the detection voltage VDET also gets higher as the level of the power supply voltage VDD increases. Alternatively, the level of the bias voltage VBIAS and/or the level of the detection voltage VDET also gets lower as the level of the power supply voltage VDD decreases.

The reference circuit 120 generates a reference voltage VREF1 according to the power supply voltage VDD. In some embodiments, the reference circuit 120 may be implemented by a simple current mirror circuit (for example but not limited, a circuit shown in FIG. 2), so as to reduce circuit costs. The level hold circuit 130 selectively transmits the reference voltage VREF1 to a node N1 according to the bias voltage VBIAS and outputs a reference voltage VREF2 via the node N1, and holds a level of the reference voltage VREF2 for a period of time after stopping transmitting the reference voltage VREF1 to the node N1. The comparator circuit 140 compares the reference voltage VREF2 with the detection voltage VDET to generate the power detection signal PGD.

The detection voltage VDET and the bias voltage VBIAS also start to lower when the level of the power supply voltage VDD starts to decrease, and the level of the reference voltage VREF2 can be continually held for a period of time by the level hold circuit 130. When the level of the detection voltage VDET is lower than the level of the reference voltage VREF2, the comparator circuit 140 may generate the power detection signal PGD having a predetermined logical value (for example but not limited to, logic 0), so as to indicate that the level of the power supply voltage VDD is too low. Since the reference circuit 120 generates the reference voltage VREF1 according to the power supply voltage VDD and is implemented by a simple current mirror circuit, the level of the reference voltage VREF1 may also be affected and become inaccurate when the power supply voltage VDD starts to decrease. With the level hold circuit 130 provided, the level of the reference voltage VREF2 can be held for a period of time after the power supply voltage VDD starts to decrease, hence ensuring that the comparator circuit 140 remains able to correctly detect the detection voltage VDET to further generate a proper power detection signal PGD. Thus, errors of the comparator circuit 140 during low-voltage detection can be prevented. Related operation details are to be further described with reference to FIG. 3 shortly. In some embodiments, the comparator circuit 140 may be implemented by a voltage comparator; however, the present application is not limited to such example.

In some embodiments, the comparator circuit 140 is activated according to an enable signal EN and starts comparing the reference voltage VREF2 with the detection voltage VDET, accordingly generating the power detection signal PGD. The delay circuit 150 may generate the enable signal EN according to a clock signal CLK at power-on of the power supply voltage VDD, wherein the clock signal CLK starts to be generated at power-on of the power supply voltage VDD. Shortly after power-on of the power supply voltage VDD, it is possible that the reference voltage VREF1, the reference voltage VREF2, the bias voltage VBIAS and/or the detection voltage VDET have not yet reached predetermined target levels. With the delay circuit 150, a delay period can be introduced shortly after power-on of the power supply voltage VDD, and thus the comparator circuit 140 stays inactivated according to the enable signal EN and thus does not compare the reference voltage VREF2 with the detection voltage VDET during this delay period, so as to prevent from generating any incorrect power detection signal PGD. Once the delay period has elapsed, the reference voltage VREF1, the reference voltage VREF2, the bias voltage VBIAS and/or the detection voltage VDET may then rise to the respective predetermined target levels. Therefore, once the delay period has elapsed, the comparator circuit 140 may then be activated according to the enable signal EN so as to start comparing the reference voltage VREF2 with the detection voltage VDET.

Figure 2:
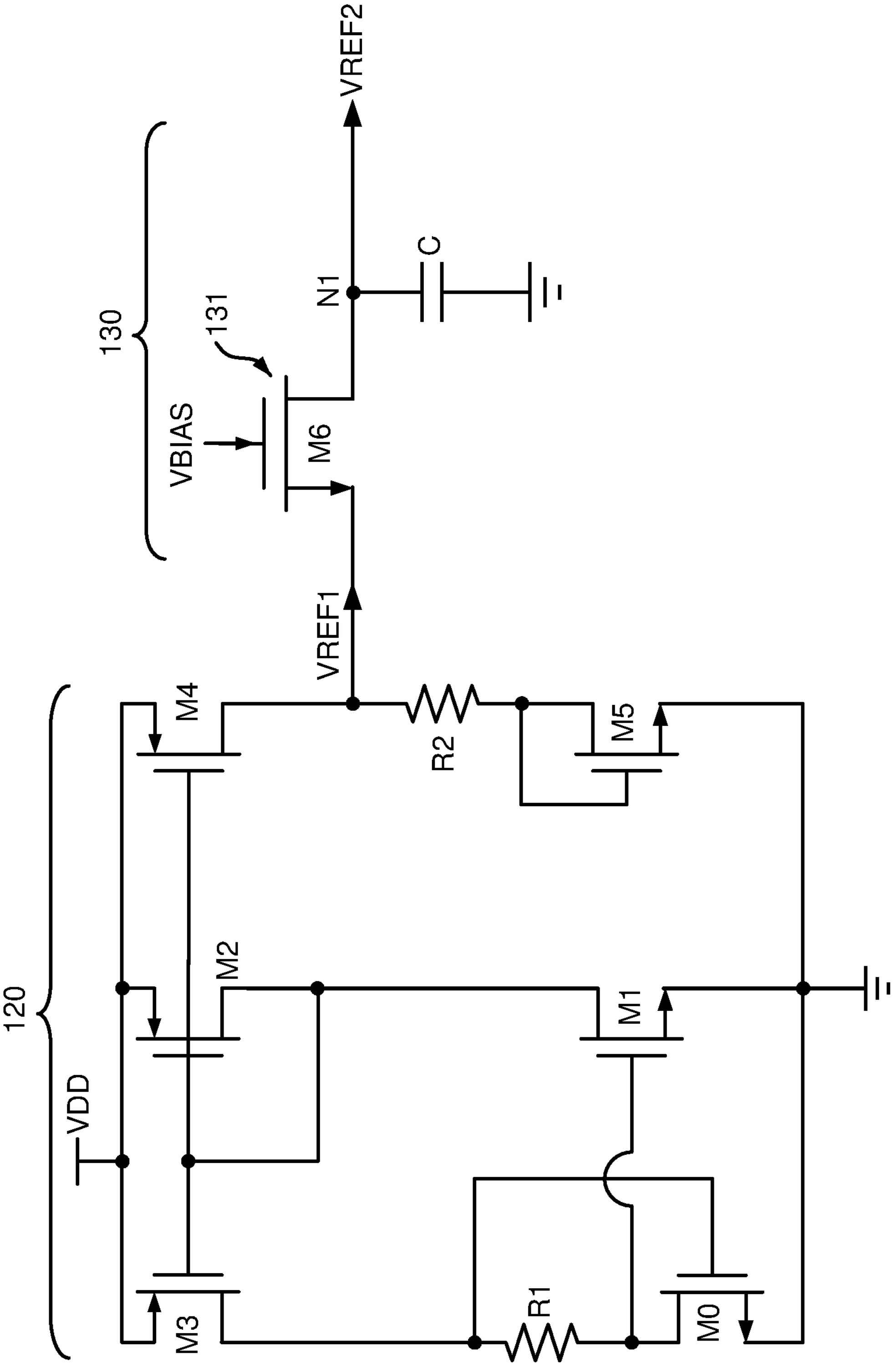
FIG. 2 is a schematic diagram of a reference circuit and a level hold circuit in FIG. 1 according to some embodiments of the present application.

FIG. 2 shows a schematic diagram of the reference circuit 120 and the level hold circuit 130 in FIG. 1 according to some embodiments of the present application. The reference circuit 120 includes multiple transistors M0 to M5 and multiple resistors R1 and R2. A first terminal (for example, the drain) of the transistor M0 is coupled to a first end of the resistor R1, a second terminal (for example, the source) of the transistor M0 is coupled to ground, and a control terminal (for example, the gate) of the transistor M0 is coupled to a second end of the resistor R1. A first terminal of the transistor M1 is coupled to a second terminal of the transistor M2, a second terminal of the transistor M1 is coupled to ground, and a control terminal of the transistor M1 is coupled to the first terminal of the transistor M0. A first terminal of the transistor M2 receives the power supply voltage VDD, and a second terminal of the transistor M2 is coupled to a control terminal of the transistor M2. A first terminal of the transistor M3 receives the power supply voltage VDD, a second terminal of the transistor M3 is coupled to the second end of the resistor R1, and a control terminal of the transistor M3 is coupled to the second terminal and the control terminal of the transistor M2. A first terminal of the transistor M4 receives the power supply voltage VDD, a second terminal of the transistor M4 is coupled to a first end of the resistor R2 and outputs the reference voltage VREF1, and a control terminal of the transistor M4 is coupled to the control terminal of the transistor M2. A first terminal of the transistor M5 is coupled to a control terminal of the transistor M5 and a second end of the resistor R2, and a second terminal of the transistor M5 is coupled to ground.

With the configuration above, the multiple transistors M0 to M3 and the resistor R1 can form a circuit part that generates a main current, and the multiple transistors M4 and M5 and the resistor R2 can form a circuit part mirroring the main current in the current mirror circuit to generate the reference voltage VREF1. It should be noted that the configuration details of the reference circuit 120 above are examples, and are not to be construed as limitation to the present application.

The level hold circuit 130 includes a switch 131 and a capacitor C. In this example, the switch 131 may be implemented by a transistor M6; however, the present application is not limited to such example. A first terminal of the switch 131 (for example, the source of the transistor M6) is coupled to the reference circuit 120 to receive the reference voltage VREF1, a second terminal of the switch 131 (for example, the drain of the transistor M6) is coupled to the node N1, and a control terminal of the switch 131 (for example, the gate of the transistor M6) is coupled to the voltage generator circuit 110 in FIG. 1 to receive the bias voltage VBIAS. The switch 131 may be selectively turned on according to the bias voltage VBIAS, so as to transmit the reference voltage VREF1 to the node N1. The capacitor C is coupled between the node N1 and ground. In this example, the transistor M6 may be an N-type transistor. Thus, when the bias voltage VBIAS is at a predetermined target level after power-on of the power supply voltage VDD, the switch 131 may be turned on so as to start transmitting the reference voltage VREF1 to the node N1. In this case, the capacitor C can be charged by the reference voltage VREF1 to generate the reference voltage VREF2. When the level of the power supply voltage VDD starts to decrease, the level of the bias voltage VBIAS also starts to lower, such that the switch 131 gradually switches to be turned off. When the level of the power supply voltage VDD becomes too low, the level of the bias voltage VBIAS is insufficient to turn on the switch 131, such that the switch 131 stops transmitting the reference voltage VREF1 to the node N1. In this case, because the capacitor C still stores an amount of charge corresponding to the level of the reference voltage VREF2 and the capacitor C does not contain any path for active discharging, the capacitor C can hold the level of the reference voltage VREF2 for a period of time.

Figure 3:
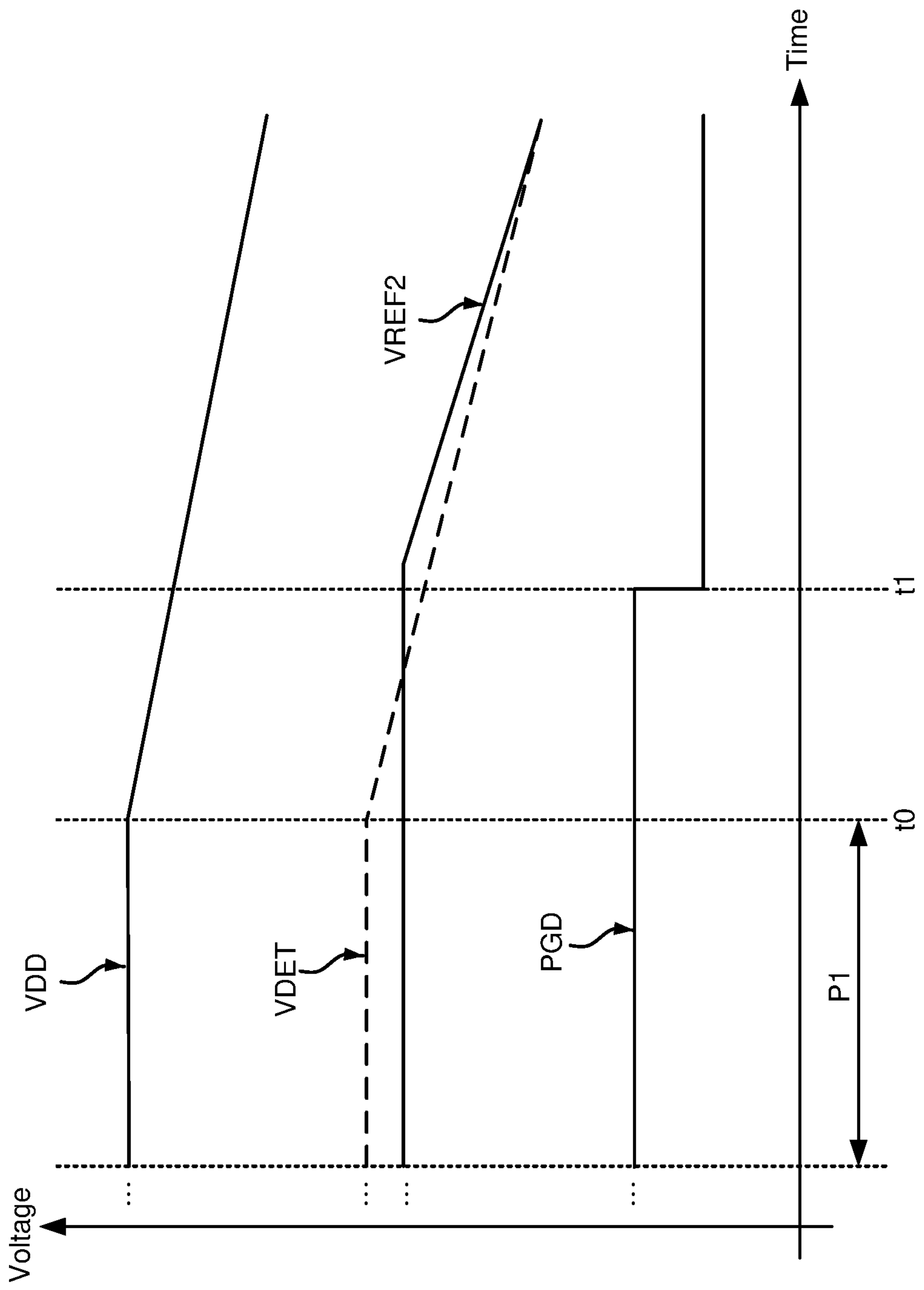
FIG. 3 is a waveform schematic diagram of part of signals in FIG. 1 and FIG. 2 according to some embodiments of the present application.

FIG. 3 shows a waveform schematic diagram of part of signals in FIG. 1 and FIG. 2 according to some embodiments of the present application. FIG. 3 shows relations of changes in the levels of the power supply voltage VDD, the detection voltage VDET, the reference voltage VREF2 and the power detection signal PGD during power-off of the power supply voltage VDD. In a period P1, the power supply voltage VDD is at a predetermined target level, and accordingly the reference voltage VREF1, the bias voltage VBIAS (not shown in FIG. 3) and the detection voltage VDET are also at respective predetermined target levels, such that the level hold circuit 130 can transmit the reference voltage VREF1 to the node N1 to generate the reference voltage VREF2 that is at the target level. In this case, the detection voltage VDET is higher than the reference voltage VREF2, and thus the comparator circuit 140 outputs the power detection signal PGD at a high level to indicate that the power supply voltage VDD is currently at the predetermined level.

At a timing to, the level of the power supply voltage VDD starts to decrease (for example, the capacity of a battery supplying the power supply voltage is in shortage), such that the level of the detection voltage VDET also starts to lower. In this case, the level of the reference voltage VREF2 is still held unchanged by the level hold circuit 130. In other words, at the timing to, the levels of all of the power supply voltage VDD, the bias voltage VBIAS (not shown in FIG. 3), the detection voltage VDET and the reference voltage VREF1 start to lower. In contrast, the level of the reference voltage VREF2 at the timing t0 stays held by the level hold circuit 130 and does not start to lower along with the power supply voltage VDD. As the level of the power supply voltage VDD decreases, at a timing t1, the level of the detection voltage VDET becomes lower than the level of the reference voltage VREF2. In this case, the comparator circuit 140 outputs the power detection signal PGD at a low level to indicate that the level of the power supply voltage VDD is too low, so that other circuits in the system may be reset accordingly. After the timing t1, based on the power supply voltage VDD that is too low in the system, the level of the reference voltage VREF2 also lowers. As such, if a user charges the system externally in a way that the level of the power supply voltage VDD returns to the predetermined level in a following period of time, the other circuits in the system and the power detector device 100 may then resume their original tasks instead of using signal values and/or circuit states potentially containing anomalies, thereby improving the overall reliability of system operations.

FIG. 4 shows a flowchart of a power detection method 400 according to some embodiments of the present application. In operation S410, a bias voltage and a detection voltage are generated according to a power supply voltage. In operation S420, a first reference voltage is generated according to the power supply voltage. In operation S430, the first reference voltage is selectively transmitted to a node according to the bias voltage, a second reference voltage is output via the node, and a level of the second reference voltage is held after the transmitting of the first reference voltage to the node is stopped. In operation S430, the second reference voltage is compared with the detection voltage to generate a power detection signal.

Details associated with the multiple operations of the power detection method 400 above can be referred from the details of the embodiments above, and are omitted herein. The multiple operations of the power detection method 400 above are merely examples, and are not limited to being performed in the order specified in these examples. Without departing from the operation means and ranges of the various embodiments of the present application, additions, replacements, substitutions or omissions may be made to the operations of the power detection method 400, or the operations may be performed in different orders (for example, entirely simultaneously performed or partially simultaneously performed).

In conclusion of the above, the power detector device and the power detection method according to some embodiments of the present application are capable of preventing a reference voltage used for detecting a power supply voltage from lowering as the power supply voltage decreases, thereby preventing errors during low-voltage detection.

While the present application has been described by way of example and in terms of the preferred embodiments, it is to be understood that the disclosure is not limited thereto. Various modifications made be made to the technical features of the present application by a person skilled in the art on the basis of the explicit or implicit disclosures of the present application. The scope of the appended claims of the present application therefore should be accorded with the broadest interpretation so as to encompass all such modifications.

What is claimed is:

1. A power detector device, comprising:

a voltage generator circuit, generating a bias voltage and a detection voltage according to a power supply voltage;

a reference circuit, generating a first reference voltage according to the power supply voltage;

a level hold circuit comprising:

a switch having a control terminal coupled to receive the bias voltage, the switch being turned on to transmit the first reference voltage to a node when the bias voltage is sufficient to turn on the switch, and being turned off to stop transmitting the first reference voltage to the node when the bias voltage is insufficient to turn on the switch; and a capacitor, coupled between the node and ground, charged by the first reference voltage to generate a second reference voltage, and holding a level of the second reference voltage after the switch is turned off, the level hold circuit outputting the second reference voltage via the node; and a comparator circuit, comparing the second reference voltage with the detection voltage to generate a power detection signal.

2. The power detector device according to claim 1, wherein the voltage generator circuit divides the power supply voltage to generate the bias voltage and the detection voltage.

3. The power detector device according to claim 1, wherein when a level of the power supply voltage starts to decrease, a level of the bias voltage and a level of the detection voltage start to lower.

4. A power detection method, comprising:

generating a bias voltage and a detection voltage according to a power supply voltage;

generating a first reference voltage according to the power supply voltage;

turning on a switch to transmit the first reference voltage to a node when the bias voltage is sufficient to turn on the switch, and turning off the switch to stop transmitting the first reference voltage to the node when the bias voltage is insufficient to turn on the switch;

charging a capacitor by the first reference voltage to generate a second reference voltage, the capacitor being coupled between the node and ground, and holding a level of the second reference voltage by the capacitor after the switch is turned off;

outputting the second reference voltage via the node; and comparing the second reference voltage with the detection voltage to generate a power detection signal.

5. The power detection method according to claim 4, wherein the generating of the bias voltage and the detection voltage according to the power supply voltage comprises:

dividing the power supply voltage to generate the bias voltage and the detection voltage.

6. The power detection method according to claim 4, further comprising:

holding the level of the second reference voltage for a period of time when the level of the power supply voltage starts to decrease, wherein a level of the bias voltage and a level of the detection voltage start to lower when the level of the power supply voltage starts to decrease.

7. The power detection method according to claim 4, wherein the comparing of the second reference voltage with the detection voltage to generate the power detection signal comprises:

starting comparing the second reference voltage with the detection voltage according to an enable signal, wherein the enable signal is generated by a delay circuit according to a clock signal at power-on of the power supply voltage.

8. A power detector device, comprising:

a voltage generator circuit, generating a bias voltage and a detection voltage according to a power supply voltage;

a reference circuit, generating a first reference voltage according to the power supply voltage;

a level hold circuit, transmitting the first reference voltage to a node when the bias voltage is sufficient to cause the transmitting, outputting a second reference voltage via the node, and holding a level of the second reference voltage after the bias voltage becomes insufficient to cause the transmitting such that the transmitting of the first reference voltage to the node is stopped;

a comparator circuit, comparing the second reference voltage with the detection voltage to generate a power detection signal; and a delay circuit, generating an enable signal after a delay period that is timed from power-on of the power supply voltage using a clock signal, wherein the comparator circuit is activated according to the enable signal to start comparing the second reference voltage with the detection voltage after the delay period elapses.

* * * * *